United States Patent [19]
Hong

[11] Patent Number: 5,686,332
[45] Date of Patent: Nov. 11, 1997

[54] PROCESS FOR FABRICATING FLASH MEMORY DEVICES

[75] Inventor: Gary Hong, Hsinchu, Taiwan

[73] Assignee: United Microelectronics Corporation, Hsinchu, Taiwan

[21] Appl. No.: 556,495

[22] Filed: Nov. 13, 1995

[51] Int. Cl.$^6$ .............................................. H01L 21/8247
[52] U.S. Cl. .......................... 437/43; 437/48; 437/52; 437/49; 437/228; 437/225
[58] Field of Search .......................... 437/42, 43, 48, 437/49, 52, 225, 228

[56] References Cited

U.S. PATENT DOCUMENTS

| | | |
|---|---|---|
| 5,198,380 | 3/1993 | Harari ........................ 437/43 |
| 5,268,319 | 12/1993 | Harari ........................ 437/43 |
| 5,534,456 | 7/1996 | Juan et al. .................. 437/43 |
| 5,541,130 | 7/1996 | Ogura et al. ................ 437/43 |
| 5,554,553 | 9/1996 | Harari ........................ 437/43 |
| 5,595,924 | 1/1997 | Juan et al. .................. 437/43 |

Primary Examiner—Viet Q. Nguyen
Attorney, Agent, or Firm—Ladas & Parry

[57] ABSTRACT

A process for fabricating on a semiconductor substrate flash memory devices capable of sustaining a high-efficiency memory erasure operation. A number of field oxide layers and gate oxide layers are first formed over the substrate. A number of first conducting layers are then formed over the field oxide layers and gate oxide layers in a first direction. Ions are implanted into the substrate to form bit lines. Gate dielectric layers are then formed over the first conducting layers. A number of second conducting layers are then formed with two sidewalls to constitute word lines. First spacers are then formed over the sidewalls of the second conducting layers. The gate dielectric layer and first conducting layer are etched into floating gates. The first spacers are then removed. Second and third spacers are then formed for the second conducting layers and the floating gates to reveal a portion of the gate dielectric layer at the edges of the floating gates. The revealed portion of the gate dielectric layer is then removed to form open windows for tunnel oxide layers. A number of third conducting layers are then formed over the tunnel oxide layers as erase gates for the flash memory device.

8 Claims, 6 Drawing Sheets

PROCESS FOR FABRICATING FLASH MEMORY DEVICES

BACKGROUND OF THE INVENTION

1. Field of the Invention

The present invention relates in general to a process for fabricating flash memory devices. In particular, the present invention relates to a process for fabricating flash memory devices capable of high-efficiency memory cell erasure operations. More particularly, the present invention relates to a process for fabricating flash memory devices having reduced erasure voltage requirements.

2. Technical Background

Flash ROM semiconductor integrated circuit devices as fabricated by the conventional process of fabrication are limited by several disadvantages concerning their inherent high voltage required to erase them, as well as the limitations on the possible production yield. Efforts to improve the coupling ratio so as to reduce the erasure voltage required in the conventional fabricating process have been made but with limited success. An examination of one such effort is briefly described herein for the understanding of the present invention. For this purpose, FIG. 1 of the accompanying drawing of the present invention schematically shows the cross-sectional view of the memory cell of a conventional flash memory device.

Figure 1:
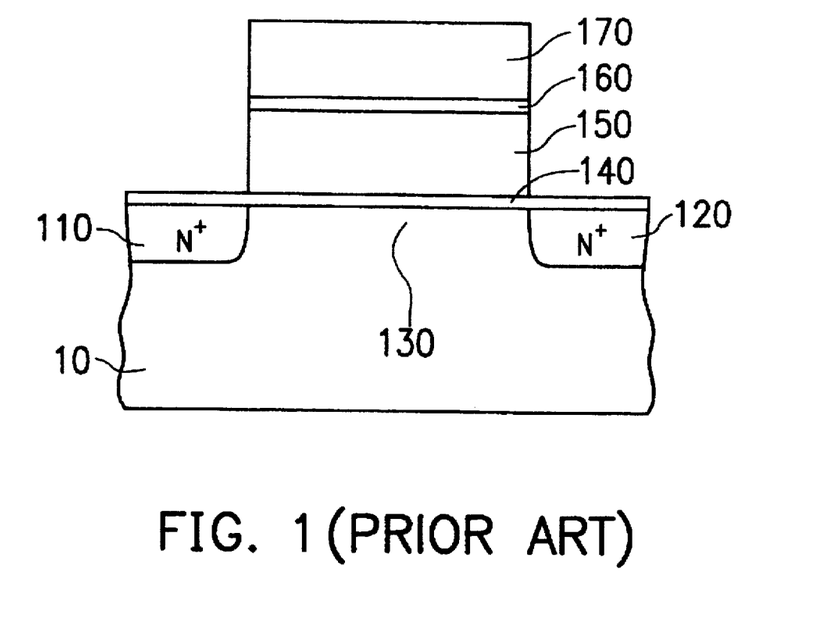
FIG. 1 schematically shows the cross-sectional view of a memory cell of a conventional flash memory device.

As is seen in FIG. 1, P-type semiconductor silicon substrate 10 constitutes the basis for the fabrication of the conventional flash memory device. Within the designated locations in the substrate, N-type drain region 110 and N-type source region 120 are formed. In between drain and source regions 110 and 120 is channel region 130 for the memory cell transistor. Tunnel oxide layer 140 is deployed over the surface of substrate 10, covering the areas including drain and source regions 110 and 120. Over tunnel oxide layer 140 is floating gate 150 of the memory cell transistor. On top of floating gate 150 is formed layer of gate dielectric 160, which pads control gate 170 of the memory cell transistor.

Figure 2:
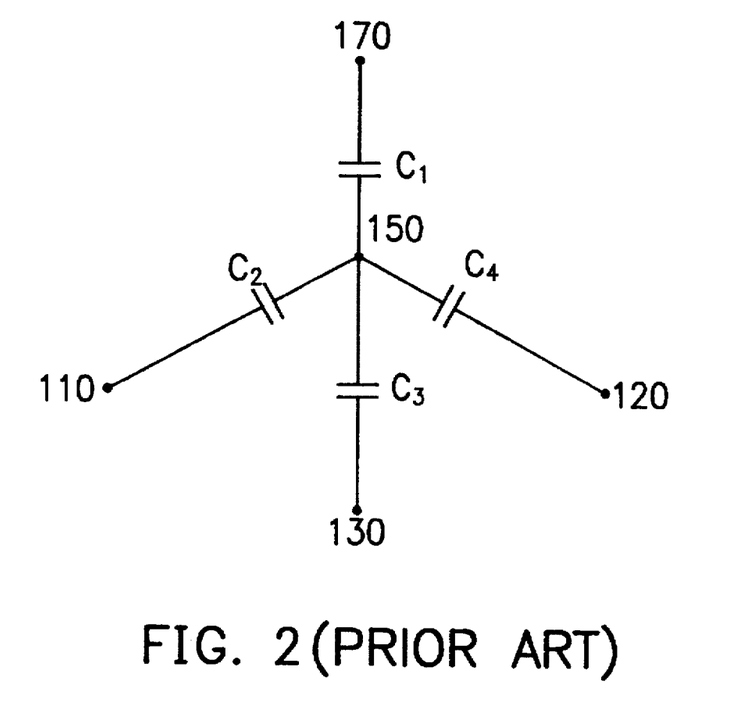
FIG. 2 shows the equivalent circuit of the memory cell of the conventional flash memory device of FIG. 1.

An equivalent circuit of the memory cell of the conventional flash memory device as generally depicted in the cross-sectional view of FIG. 1 is shown in FIG. 2. Parasitic capacitances would inherently be present between the structural layers of the entire structural configuration of each of the transistors in the memory cells of the flash memory device. Specifically, C1 is the equivalent capacitor between floating gate 150 and control gate 170. C2 is the equivalent capacitor between floating gate 150 and drain region 110. C3 is the equivalent capacitor between floating gate 150 and channel region 130. And, C4 is the equivalent capacitor between floating gate 150 and source region 120. As can be observed in the equivalent circuit, the four capacitors are connected to a common node, which is floating gate 150 of the memory cell transistor.

In normal operating modes of the memory cell transistor of the flash memory device, a working voltage applied to control gate 170 is coupled to floating gate 150 with an inevitable loss of voltage level. The effective rate of the coupling of the working voltage signal into floating gate 150 via application to control gate 170 is generally referred to as the voltage coupling ratio, which can be appropriately expressed as $CR = C1/(C1+C2+C3+C4)$. As persons skilled in the art can appreciate, the larger this coupling ratio is, the better. A reduction in the equivalent capacitor C4 contributes to an increase in coupling ratio CR. In general, the larger the coupling ratio CR, the smaller the required voltage for an erasure operation of the memory cell transistor for the flash memory device.

The capacitance of equivalent capacitor C4 is directly proportional to the surface area of tunnel oxide layer 140. However, tunnel oxide layer 140 is one of the largest layers in terms of surface area in the semiconductor structural configuration of the memory cell transistor. It is therefore relatively more difficult to miniaturize, so that the coupling ratio CR is also difficult to improve. Further, the larger surface area creates a larger possibility of defects, which in turn, results in production yield rate limitations.

SUMMARY OF THE INVENTION

It is therefore an object of the present invention to provide a process for fabricating flash memory devices capable of sustaining high-efficiency memory erasure operation by having a reduced erasure voltage requirement.

It is another object of the present invention to provide a process for fabricating flash memory devices capable of sustaining high-efficiency memory erasure operation by having an improved electrical coupling ratio over the erase gate.

The present invention achieves the above-identified objects by providing an innovative process for fabricating flash memory devices on a semiconductor substrate. Sidewall spacers of both word line conducting layers and floating gate layers are employed to define a relatively small surface area for a tunnel oxide layer. Precise control over the coupling ratio of the flash memory device is thereby obtained, so that the voltage level required for the application of memory content erasure can be effectively reduced. Such precise control over the device coupling ratio also helps to prevent the possibility of device over-erasure. Further, an embodiment of the present invention provides for the height of the floating gate sidewall spacer to be relatively smaller than the thickness of the floating gate, allowing the tunnel oxide layer to be extended to cover the edge of the floating gate layer, thereby increasing the electrical field intensity, which is an advantageous factor for memory content erasure.

In accordance with the innovative process of the present invention, a number of field oxide layers are first formed at the designated portions over the surface of the substrate. Each of the field oxide layers is generally extended in a first direction on the substrate, and each of the field oxide layers is aligned and spread over the substrate in a second direction and forms an array. Gate oxide layers are then formed over the substrate. A number of first conducting layers are next formed over the field oxide layers and gate oxide layers in the first direction. The process then utilizes the first conducting layers and field oxide layers as a shielding mask for implementing an ion implantation procedure that implants impurities into the substrate, thereby forming bit lines for the flash memory device. Gate dielectric layers are then formed over the first conducting layers. A number of second conducting layers are next formed along the second direction straddling the field oxide layers and covering the gate dielectric layers. Each of the second conducting layers has two sidewalls and an insulating layer formed thereon, thereby constituting word lines for the flash memory device. First spacers are then formed over the sidewalls of the second conducting layers. An etching procedure is carried out through the second conducting layers, insulating layer and first spacers to shape the gate dielectric layer and first conducting layer into floating gates, each of the floating gates having two peripheral edges. The first spacers are then removed. Second and third spacers are then formed over the sidewalls of the second conducting layers and the floating gates respectively, whereby the thickness of the second spacers is less than that of the first sidewall spacers, thereby revealing a portion of the gate dielectric layer at the edges of the floating gates. Next, the revealed portion of the gate dielectric layer is removed thereby forming the first open windows of the floating gates. Tunnel oxide layers are then formed within the first open windows. A number of third conducting layers are then formed over the tunnel oxide layers in the second direction thereby forming erase gates for the flash memory device.

Other objects, features, and advantages of the present invention will become apparent by way of the following detailed description of the preferred but non-limiting embodiments.

BRIEF DESCRIPTION OF THE DRAWING

The detailed description is made with reference to the accompanying drawings in which.

DETAILED DESCRIPTION OF THE PREFERRED EMBODIMENT

Figure 3:
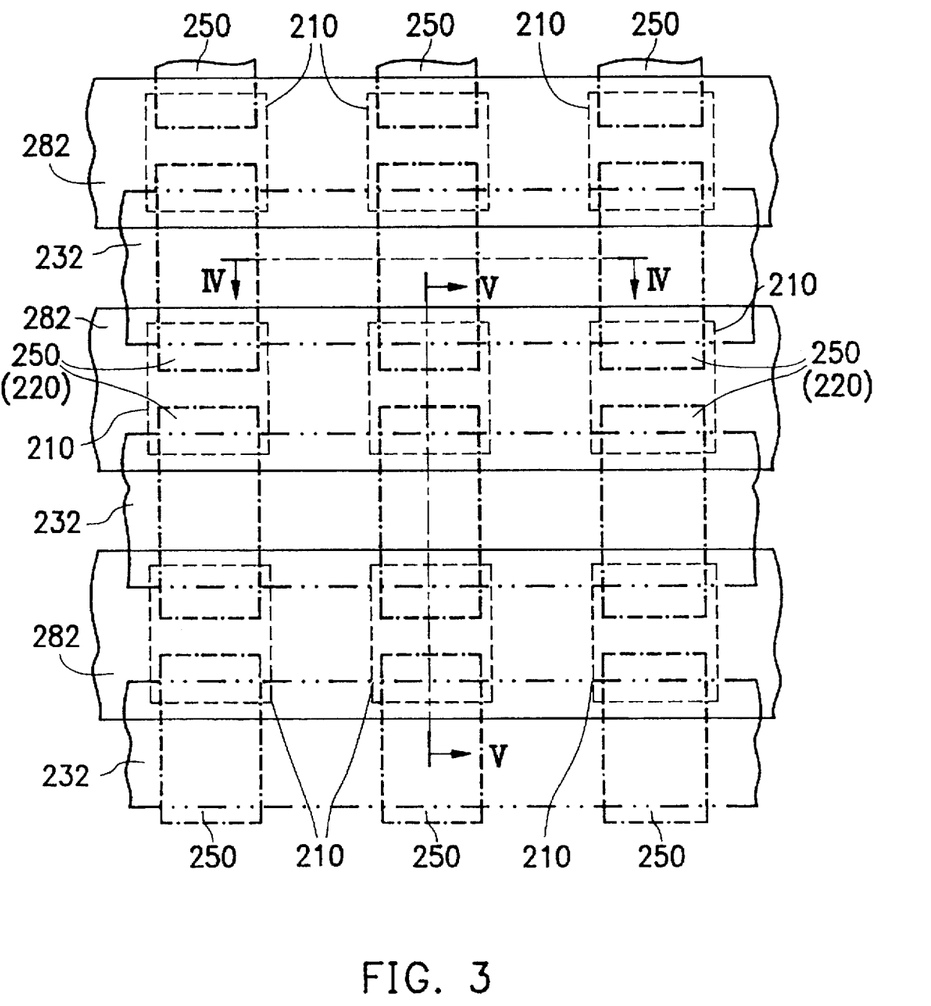
FIG. 3 schematically shows the top view of a number of the memory cells of the flash memory device as fabricated in a process in accordance with the preferred embodiment of the present invention.

For the description of the preferred embodiment of the present invention, reference is directed to FIG. 3 of the drawings. FIG. 3 schematically shows a top view of a memory cell of a flash memory device as fabricated in a process in accordance with a preferred embodiment of the present invention. For the same embodiment, reference should also be made to FIGS. 4a–4c, in which are schematically shown the cross-sectional views of the memory cell of the flash memory device of FIG. 3 taken along the IV—IV line therein as depicted in the selected process stages of the fabrication. Similarly, FIGS. 5a–5g schematically show the cross-sectional views of the memory cell of the flash memory device of FIG. 3 taken along the V—V line therein as depicted in the selected process stages of the fabrication. The two sets of cross-sectional views of the fabricated flash memory cell transistor, together with the accompanying top view, serve to present a detailed structural configuration of the subject memory cell transistor as fabricated.

Persons skilled in the art should well appreciate that the embodiments as exemplified herein are only provided for the purpose of description, and do not constitute any limitation of the present invention. For example, in the first described embodiment of the present invention, the flash memory semiconductor device is fabricated on a P-type silicon substrate. Although the description describes a P-type substrate, the silicon substrate can also be of an N-type implementation. The fabrication process steps are described as follows.

Stage 1

Figure 4A:
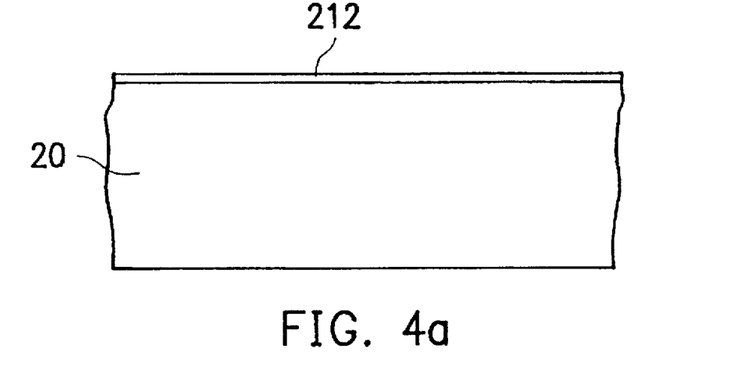
FIGS. 4a–4c schematically show the cross-sectional views of the memory cell of the flash memory device of FIG. 3 taken along the IV—IV line therein as depicted in the selected process stages of the fabrication.
Figure 5A:
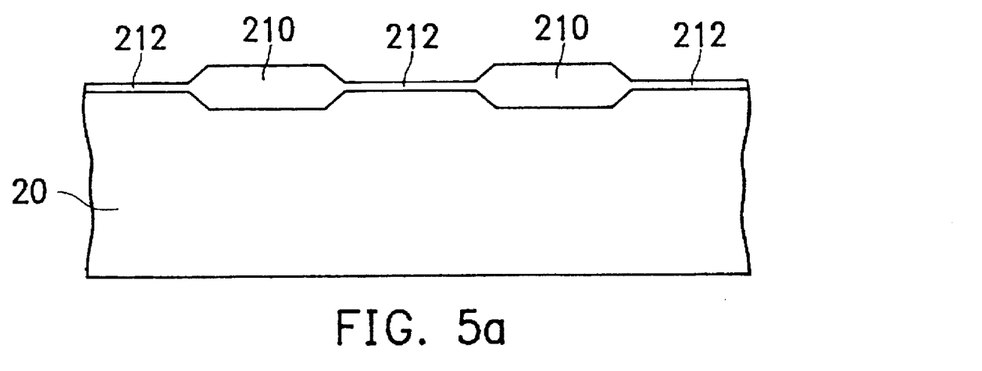
FIGS. 5a–5g schematically show the cross-sectional views of the memory cell of the flash memory device of FIG. 3 taken along the V—V line therein as depicted in the selected process stages of the fabrication.

Refer simultaneously to FIGS. 4a and 5a, for the cross-sectional views, from two different directions, of the semiconductor substrate for the construction of the memory cell transistor of the flash memory device. As is seen in the drawings, semiconductor substrate 20, P-type as selected for the exemplifying description of the first embodiment of the present invention, has formed thereon a number of field oxide layers 210 in designated locations. Field oxide layers 210 are generally oriented longitudinally in a first direction over the surface of substrate 20. For example, as can be seen, they are generally long strips that appear in a vertical direction in the top view shown in FIG. 3. Field oxide layers 210 extend over the surface of substrate 20 in a generally parallel manner, constituting an array of field oxides that extend in a second direction over the surface for the memory cell transistors of the flash memory device. After the formation of field oxides 210, gate oxides 212 are then formed over the surface of substrate 20. This can be done by, for example, forming field oxide layers 210 in a LOCOS (local oxidation of silicon) process, followed by the formation of gate oxide layers 212, with a thickness of about, for example, 100–200 Å.

Stage 2

Figure 4B:
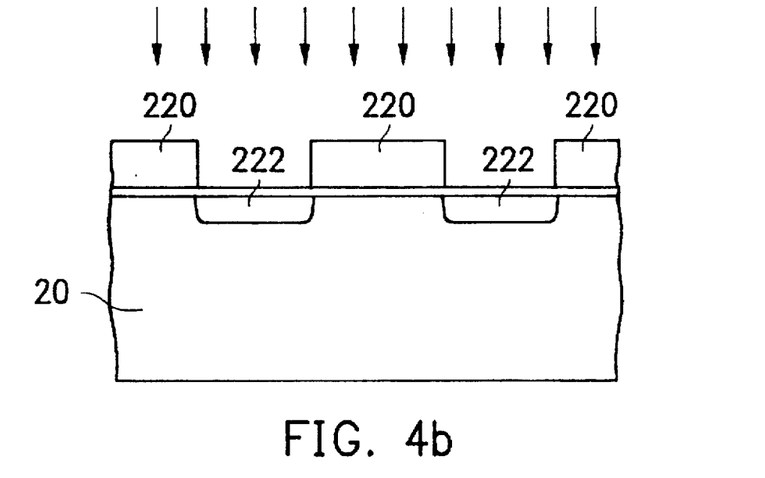
Figure 5B:
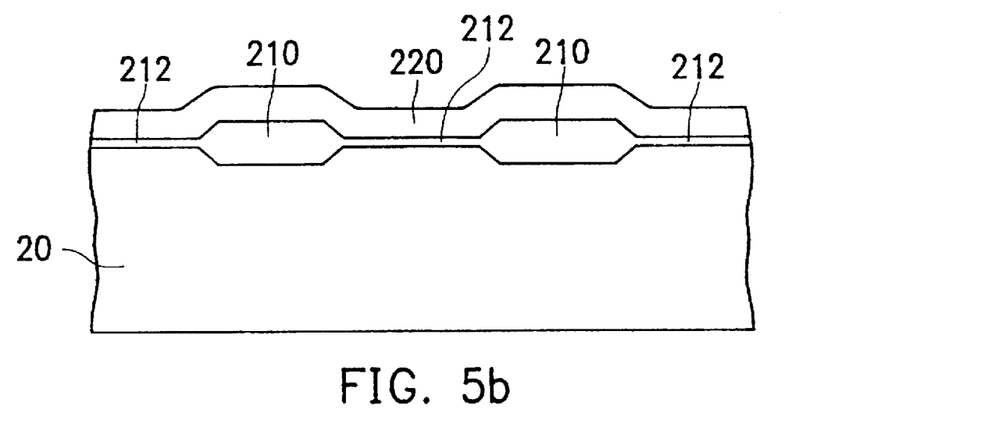

Referring next to FIGS. 4b and 5b, simultaneously with FIG. 3, a number of first conducting layers 220 are then formed over the surface of field oxide layers 210 that extend generally in the first direction as well as along the surface of gate oxide layers 212. First conducting layers 220, together with field oxide layers 210, may then be utilized as the shielding mask for the implementation of an ion implantation procedure that implants impurities into the designated regions of substrate 20 to form bit lines for the memory cells of the flash memory device. This can be done by, for example, depositing a layer of polysilicon, which is then subjected to an impurity implantation procedure to reduce the impedance thereof. A photolithography procedure may then be employed to etch first conducting layer 220 so that the desired patterns in layer 220 may be obtained. N-type impurities such as, for example, arsenic As, may then be implanted at an implantation energy level of about 50 keV, with the achieved impurity concentration of about, for example, $5 \times 10^{15}$ atoms/cm$^2$. The result of this N-type impurity implantation into P-type substrate 20 in the designated regions is the formation of N$^+$-type implantation regions 222, which serve as the bit lines for the memory cells of the flash memory device.

Stage 3

Figure 4C:
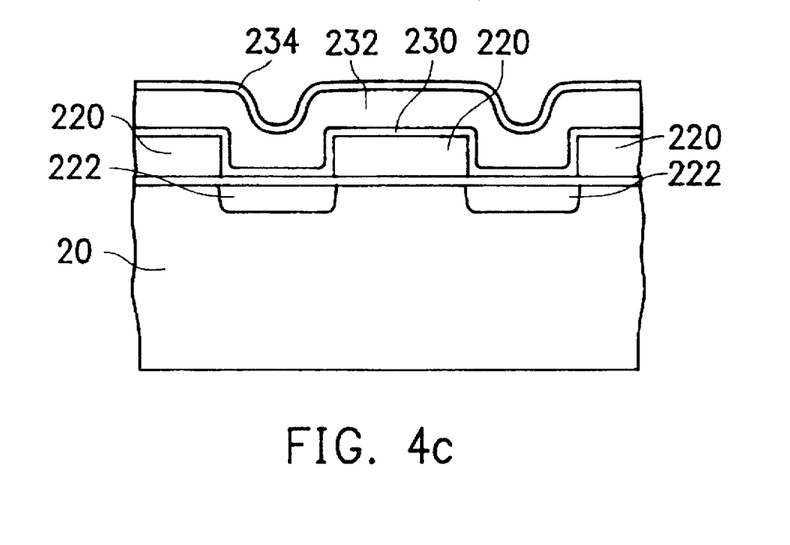
Figure 5C:
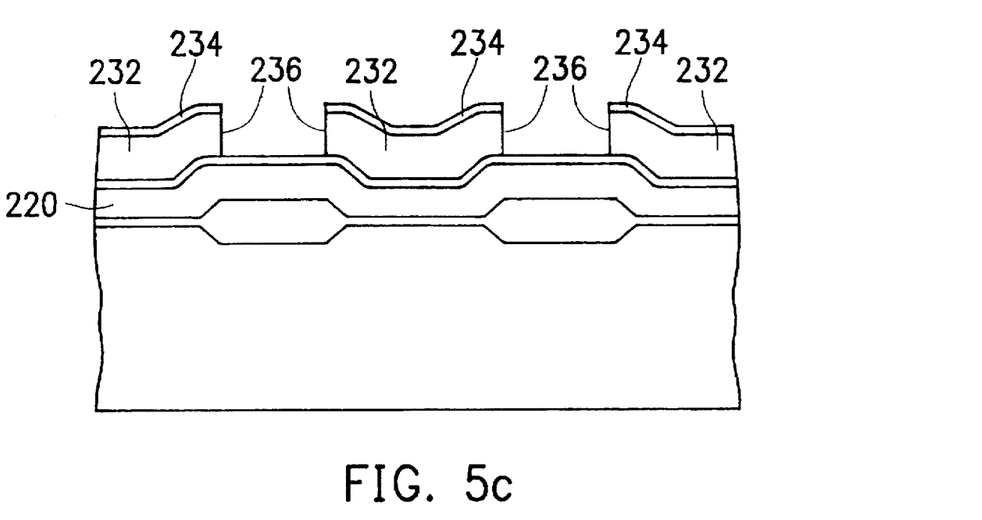

Referring next to FIGS. 4c and 5c, as well as FIG. 3, gate dielectric layer 230 is then formed over first conducting layers 220. Then, second conducting layers 232 are then formed over gate dielectric layer 230 which straddles field oxide layers 210 in the second direction over the surface of the substrate 20. These second conducting layers serve as the word lines for the memory cells of the flash memory device being fabricated. The second conducting layers each have sidewalls 236. Insulating layers 234 are then formed over the surface of second conducting layers 232. This can be achieved by, for example, first forming an oxide-nitride-oxide (ONO) structural configuration as gate dielectric layer 230. Polysilicon and oxide layers are then deposited, in which the polysilicon layer is then subjected to an ion implantation procedure, and followed by a photolithography procedure to etch into the oxide and polysilicon layers. The etching forms insulating layers 234 and conducting layers 232, in the desired pattern.

Stage 4

Figure 5D:
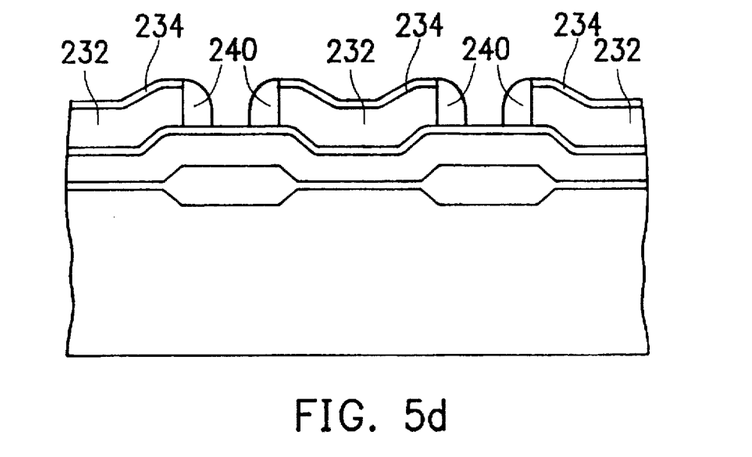

Referring to FIG. 5d, sidewall spacers 240 are then formed to cover sidewalls 236 of second conducting layer 232. This is done by, for example, depositing a layer of nitride and then performing an etching-back procedure to form sidewall spacers 240 for sidewalls 236.

Stage 5

Figure 5E:
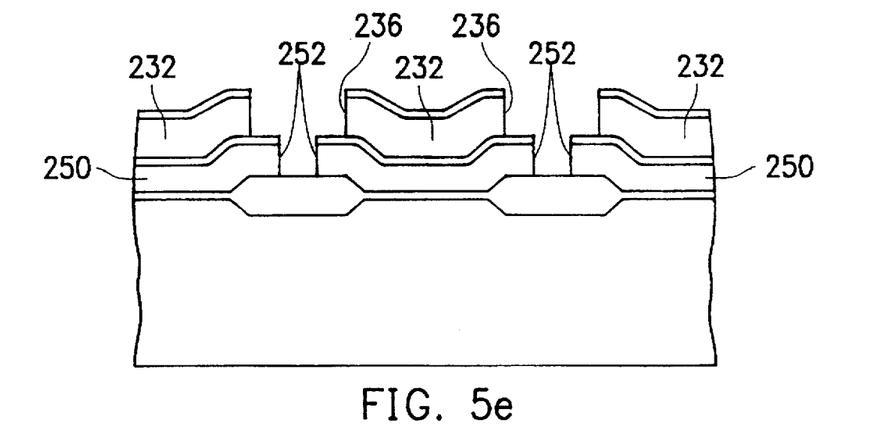

Referring next to FIG. 5e, floating gates 250 are then formed out of gate dielectric layers 230 and first conducting layer 232. This can be achieved by, for example, employing second conducting layers 232, insulating layers 234, and sidewall spacers 240 as the shielding mask for the implementation of a controlled etching procedure that shapes gate dielectric layer 230 and first conducting layer 232, so as to form the floating gates 250 having sidewalls 252 for each of the formed floating gates. Afterwards, sidewall spacers 240 may be removed.

Stage 6

Figure 5F:
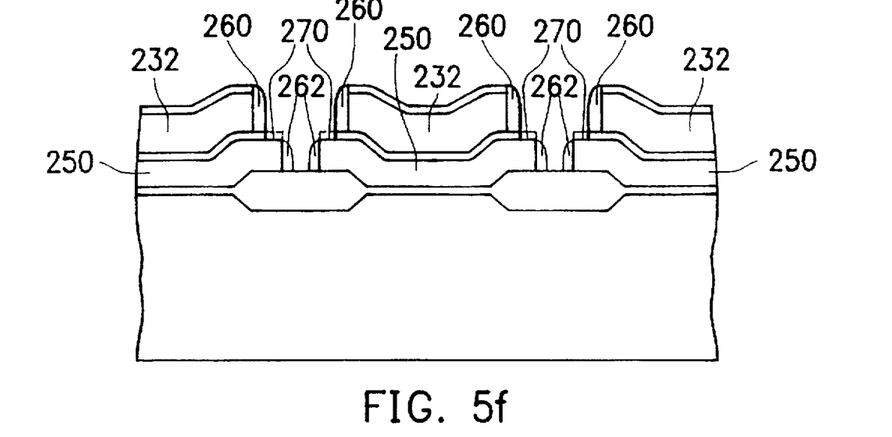

Referring next to FIG. 5f, sidewall spacers 260 and 262 for second conducting layers 232 and floating gates 250 respectively are formed over sidewalls 236 and 252 thereof. The thickness of second sidewall spacer 260 for second conducting layer 232 is controlled to be less than first sidewall spacers 240 that were previously formed and removed in Stage 5. This exposes a portion of gate dielectric layer 230 at the edges of floating gates 250 as shown in the drawing in phantom lines. The exposed portion of gate dielectric layer 230 may then be removed, leaving first open window 270 form therein as shown in the drawing. This can be achieved by, for example, depositing a layer of nitride, and then performing an etching-back procedure to form sidewall spacers 260 and 262 for second conducting layer 232 and floating gate 250 respectively. Another etching procedure then may be utilized to remove the portion of gate dielectric layers 230 as identified by the phantom lines in FIG. 5f. Open windows 270 revealing the surface of floating gate 250 are thus formed.

Stage 7

Figure 5G:
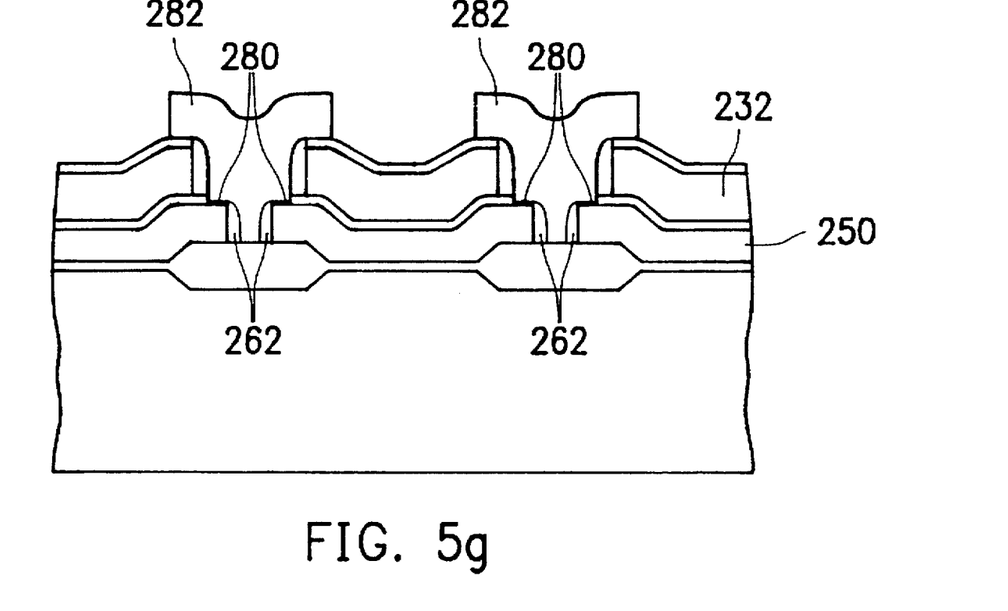

Finally, referring to FIG. 5g, open windows 270 (i.e., the exposed surface of floating gates 250) are then formed with tunnel oxide layers 280. A number of third conducting layers 282 may then be formed over tunnel oxide layers 280 which serve as erase gates for the memory cell transistors of the flash memory device being fabricated. This can be achieved by, for example, performing a thermal oxidation procedure to grow tunnel oxide layers 280 within open windows 270. Another process of polysilicon deposition is then conducted, followed by an ion implantation procedure to lower its electrical impedance. A photolithography procedure then follows to etch the deposited polysilicon layer for shaping erase gates 282 for the memory cell transistors for the flash memory device.

This generally concludes the process of fabrication of the flash memory device in accordance with the first preferred embodiment of the present invention. A second preferred embodiment, however, is also outlined here to show another applicable alternative arrangement of the configuration of third sidewall spacers 262 and open windows 270 as depicted in FIG. 5f). This second embodiment is shown in FIG. 6, which schematically shows the cross-sectional view of the memory cell of the flash memory device of FIG. 3 taken along the IV—IV line therein as depicted in one selected process stage of the fabrication.

This second preferred embodiment is generally the same as that of the first preferred embodiment described above. Basically, up to the process stage of FIG. 5e, the process steps are generally the same, hence the use of the same reference numerals designating the same or similar components in the structural configuration of the two embodiments. The primary difference between the two is apparent when FIG. 5g and FIG. 6 are compared. As is seen in comparing FIGS. 5g and 6, sidewall spacers 262a of floating gates 250 have a height that is relatively shorter than sidewall spacers 262 of corresponding floating gate 250 of FIG. 5g. In other words, the height of third sidewall spacers 262a is smaller than the thickness of floating gate layer 250. This allows the exposure of small second open windows 272 that are each next to first open windows 270 of the first embodiment.

Figure 6:
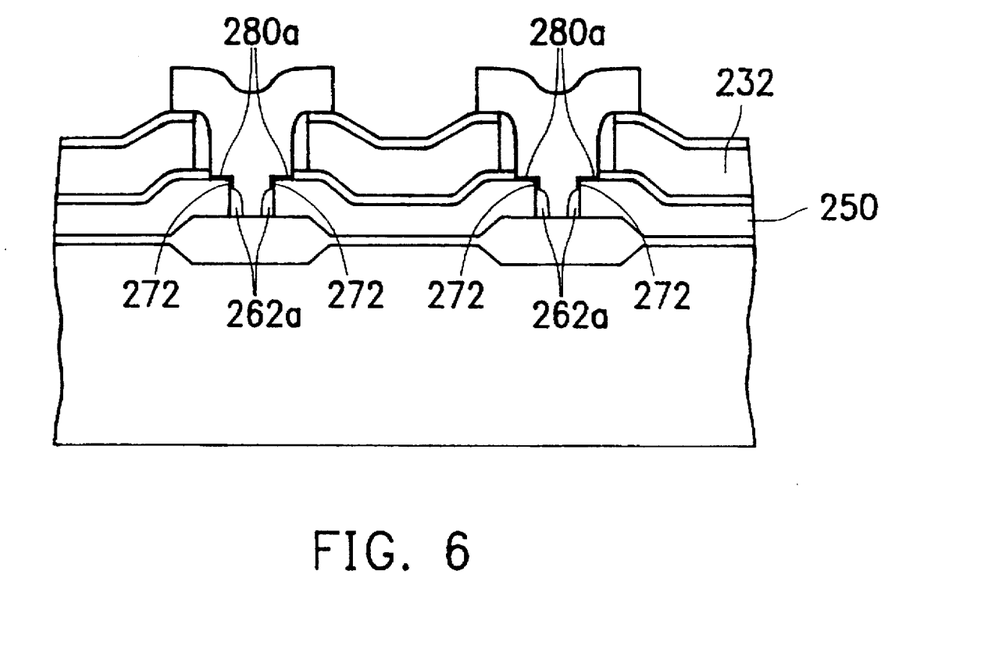
FIG. 6 schematically shows the cross-sectional view of the memory cell of the flash memory device of FIG. 3 taken along the IV—IV line therein as depicted in one selected process stage of the fabrication in accordance with another preferred embodiment of the present invention.

Referring to both FIGS. 5g and 6 for the comparison of the detailed differences, each of tunnel oxide layers 280a in the case of the second embodiment of FIG. 6 extends over second open window 272. Thus, by having the corner where first open window 270 and second open window 272 interface each other covered by the layer of tunnel oxide 280a, the electrical field intensity is raised as a result. This improves the erasure efficiency of the flash memory device being fabricated.

Since, in accordance with the present invention the sidewall spacers of the second conducting layer and the floating gate layer are employed to define the surface area of the tunnel oxide layer, it is therefore now possible to define a tunnel oxide layer with a relatively small surface area. This allows for precise control over the coupling ratio of the flash memory device, so that the voltage level required for the application of the memory content erasure can be effectively reduced. Such precise control over the device coupling ratio also helps to prevent the possibility of device over-erasure. Moreover, since the height of the sidewall spacer of the present invention is relatively smaller than the thickness of the floating gate, the tunnel oxide layer may be extended to cover the edge of the floating gate layer, thereby increasing the electrical field intensity, which is an advantageous factor for memory content erasure.

Thus, the process of fabricating flash memory device as disclosed by the present invention reduces the required erasure voltage. Although specific embodiments are exemplified in the descriptive paragraphs outlined above, persons skilled in the art, however, can appreciate the fact that many modifications to the embodiments as disclosed should still be considered to be within the scope of the present invention, which is recited in the claims that follow.

What is claimed is:

1. A process for fabricating flash memory devices on a semiconductor substrate, said process comprising the steps of:

forming a plurality of field oxide layers at designated portions over the surface of said substrate, each of said plurality of field oxide layers being generally longitudinal and extending in a first direction over the surface of said substrate, each of said plurality of field oxide layers being also aligned and spread over the surface of said substrate in a second direction to form an array thereof;

forming gate oxide layers over said substrate;

forming a plurality of first conducting layers over said field oxide layers and gate oxide layers, each of said plurality of first conducting layers being oriented in said first direction;

implanting ions into said substrate to provide a plurality of bit lines of said flash memory device;

forming gate dielectric layers over said first conducting layers;

forming a plurality of second conducting layers in said second direction straddling over said field oxide layers and covering said gate dielectric layers, each of said second conducting layers having two sidewalls and having insulating layer formed thereon, each of said second conducting layers providing word lines for said flash memory device;

forming first spacers over said sidewalls of said second conducting layers;

etching said gate dielectric layer and first conducting layer into floating gates, each of said floating gates having two peripheral edges;

removing said first spacers;

forming second and third spacers over said sidewalls of said second conducting layers and said floating gates respectively, the thickness of said second spacers being smaller than the thickness of said first spacers revealing a portion of said gate dielectric layer at the edges of said floating gates;

removing said portion of said gate dielectric layer revealed to form first open windows of said floating gates;

forming tunnel oxide layers within said first open windows; and forming a plurality of third conducting layers over said tunnel oxide layers oriented in said second direction to provide erase gates for said flash memory device.

2. The process of claim 1, wherein the step of forming second and third spacers includes the steps of forming said third spacers having a less than the thickness of said floating gates and forming second open windows at an edge of each of said floating gates adjacent to said first open window; and wherein the step of forming tunnel oxide layers includes the step of extending said tunnel oxide layers formed within said first open windows to said second open windows.

3. The process of claim 1, wherein said first conducting layer, said second conducting layer and said third conducting layer are polysilicon.

4. The process of claim 2, wherein said first conducting layer, said second conducting layer and said third conducting layer are polysilicon.

5. The process of claim 3, wherein said gate dielectric layer has an oxide-nitride-oxide structural configuration.

6. The process of claim 4, wherein said gate dielectric layer has an oxide-nitride-oxide structural configuration.

7. The process of claim 5, wherein said first spacers are nitrides, and said second and third spacers and said insulating layers are oxides.

8. The process of claim 6, wherein said first spacers are nitrides, and said second and third spacers and said insulating layers are oxides.

* * * * *